(12) United States Patent
Son et al.

(10) Patent No.: US 10,704,885 B2
(45) Date of Patent: Jul. 7, 2020

(54) INTEGRATED CIRCUIT DEVICE AND HIGH BANDWIDTH MEMORY DEVICE

(71) Applicant: Samsung Electronics Co., Ltd., Suwon-si, Gyeonggi-do (KR)

(72) Inventors: Jong Pil Son, Hwaseong-si (KR); Woo Yeong Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/388,403

(22) Filed: Apr. 18, 2019

(65) Prior Publication Data

US 2020/0132432 A1   Apr. 30, 2020

(30) Foreign Application Priority Data

Oct. 24, 2018   (KR) .................. 10-2018-0127203

(51) Int. Cl.
| | |
|---|---|
| G06F 12/02 | (2006.01) |
| G01B 7/16 | (2006.01) |
| H03K 3/03 | (2006.01) |
| H03K 21/38 | (2006.01) |
| G11C 7/22 | (2006.01) |
| H01L 25/065 | (2006.01) |
| G11C 5/06 | (2006.01) |
| H01L 25/18 | (2006.01) |

(52) U.S. Cl.
CPC ............... *G01B 7/18* (2013.01); *G11C 5/063* (2013.01); *G11C 7/222* (2013.01); *H01L 25/0657* (2013.01); *H01L 25/18* (2013.01); *H03K 3/0315* (2013.01); *H03K 21/38* (2013.01); *H01L 2225/06513* (2013.01); *H01L 2225/06541* (2013.01)

(58) Field of Classification Search
CPC ......... G11C 29/12; G11C 29/50; G11C 16/30; G11C 16/0483; G01D 9/32; G06F 12/02; H02J 1/00; H02J 13/0003; H01L 27/1156; H01L 27/1104
See application file for complete search history.

(56) References Cited

U.S. PATENT DOCUMENTS

| 8,438,931 B2 | 5/2013 | Kazama | |
|---|---|---|---|
| 2007/0234141 A1* | 10/2007 | Ausserlechner | G11C 29/12 714/718 |
| 2015/0347287 A1* | 12/2015 | Tripathi | G06F 1/3287 711/154 |

(Continued)

FOREIGN PATENT DOCUMENTS

| JP | 3169508 | 5/2001 |
|---|---|---|
| JP | 4073731 | 4/2008 |

(Continued)

*Primary Examiner* — Hien N Nguyen
(74) *Attorney, Agent, or Firm* — Myers Bigel, P.A.

(57) ABSTRACT

An integrated circuit device and a high bandwidth memory device are disclosed. The integrated circuit device includes a plurality of warpage detection sensors at a plurality of different positions, respectively, and electrically connected in series. Each of the plurality of warpage detection sensors is configured to generate a clock signal with a period that is based on a resistance that varies based on a pressure at a corresponding position, and to generate digital data by performing a counting operation in response to the clock signal.

20 Claims, 10 Drawing Sheets

(56) References Cited

U.S. PATENT DOCUMENTS

| | | | |
|---|---|---|---|
| 2016/0049207 A1* | 2/2016 | Gulati | G11C 17/16 365/96 |
| 2016/0178409 A1* | 6/2016 | Tsutsui | H02J 1/00 702/189 |
| 2018/0144960 A1 | 5/2018 | Su | |

FOREIGN PATENT DOCUMENTS

| JP | 2008082969 | 4/2008 |
|---|---|---|
| JP | 4335545 | 9/2009 |
| JP | 2009533660 | 9/2009 |
| JP | 2009236756 | 10/2009 |

\* cited by examiner

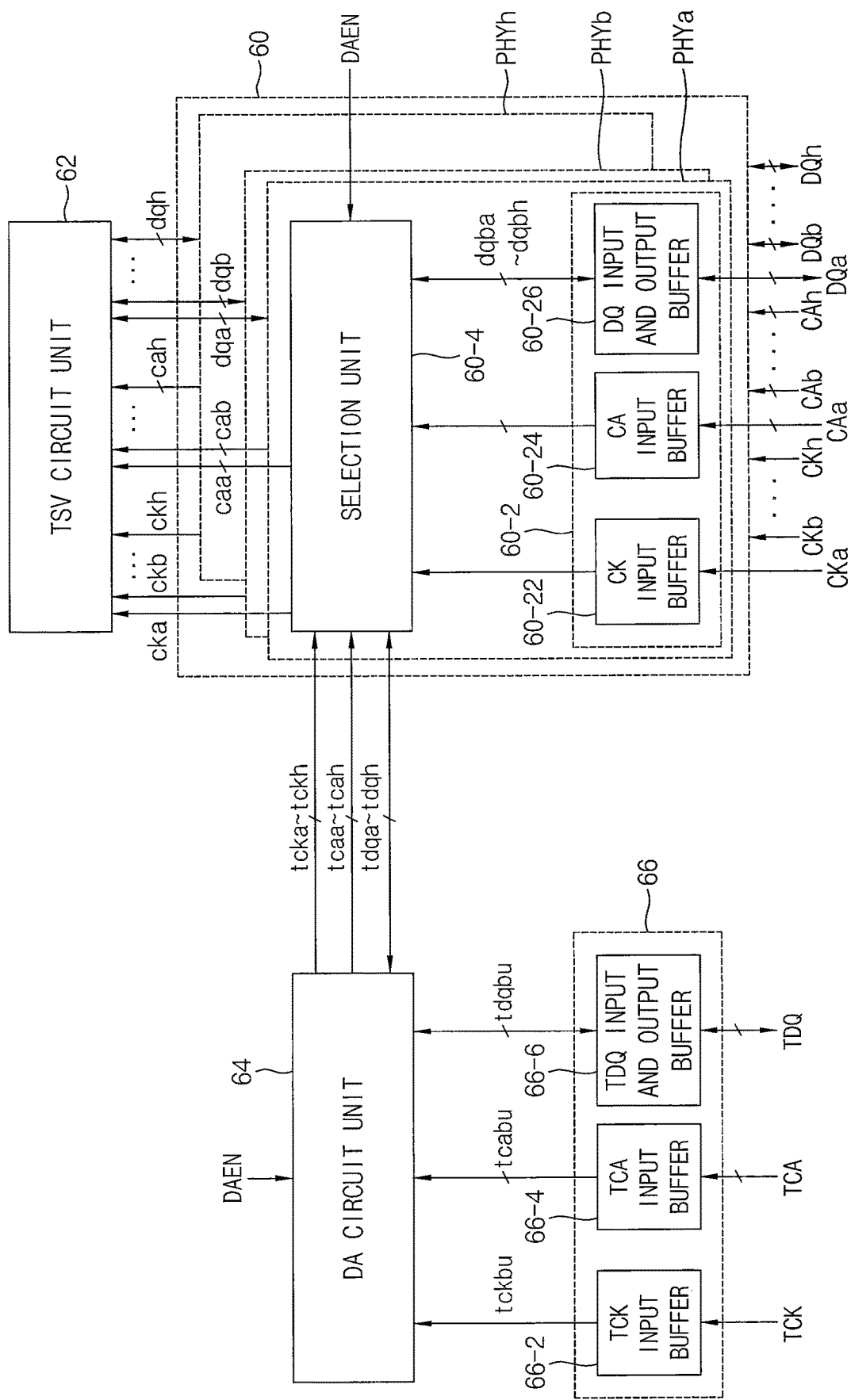

INTEGRATED CIRCUIT DEVICE AND HIGH BANDWIDTH MEMORY DEVICE

CROSS-REFERENCE TO RELATED APPLICATION

This application claims priority to Korean Patent Application No. 10-2018-0127203, filed on Oct. 24, 2018, the disclosure of which is incorporated herein by reference in its entirety.

BACKGROUND

1. Field

Embodiments of the inventive concept relate generally to integrated circuit devices and, more particularly, to high bandwidth memory devices.

2. Description of Related Art

A plurality of dies may be formed on a wafer. Each of the plurality of dies may include a plurality of circuits, which are integrated on the wafer. Further, the plurality of dies may be thinly cut. Each of the plurality of dies may be packaged in various forms. The thinly cut dies may be warped and such warpage can cause defects in a device after the packaging.

SUMMARY

The example embodiments of the inventive concept are directed to providing an integrated circuit device and a high bandwidth memory device for detecting warpage of a die.

According to example embodiments of the inventive concept, there is provided an integrated circuit device that includes a plurality of warpage detection sensors at a plurality of different positions, respectively, and electrically connected in series. For each of the warpage detection sensors, a resistance may vary based on a pressure at a corresponding position, a clock signal may be generated with a period that varies based on the resistance, and each of the plurality of warpage detection sensors may generate first digital data or second digital data by performing first and second counting operations in response to the clock signal.

According to example embodiments of the inventive concept, there is provided an integrated circuit device that includes a plurality of warpage detection sensors at a plurality of different positions and electrically connected in series. For each of the warpage detection sensors, a resistance may vary based on a pressure at a corresponding position, a clock signal may be generated with a period that varies based on the resistance, and each of the plurality of warpage detection sensors may generate digital data by performing a counting operation in response to the clock signal.

According to example embodiments of the inventive concept, there is provided a high bandwidth memory device that includes a logic die and a plurality of memory dies stacked on the logic die. Each of the plurality of memory dies may include a plurality of warpage detection sensors at a plurality of different positions, respectively, and electrically connected in series, a resistance may vary based on a pressure at a corresponding position, a clock signal may be generated with a period that varies based on the resistance, and each of the plurality of warpage detection sensors may generate digital data by performing a counting operation in response to the clock signal.

BRIEF DESCRIPTION OF THE DRAWINGS

FIG. 10 is a diagram showing a configuration of a logic die according to some embodiments of the inventive concept.

DETAILED DESCRIPTION OF EMBODIMENTS

Figure 1:
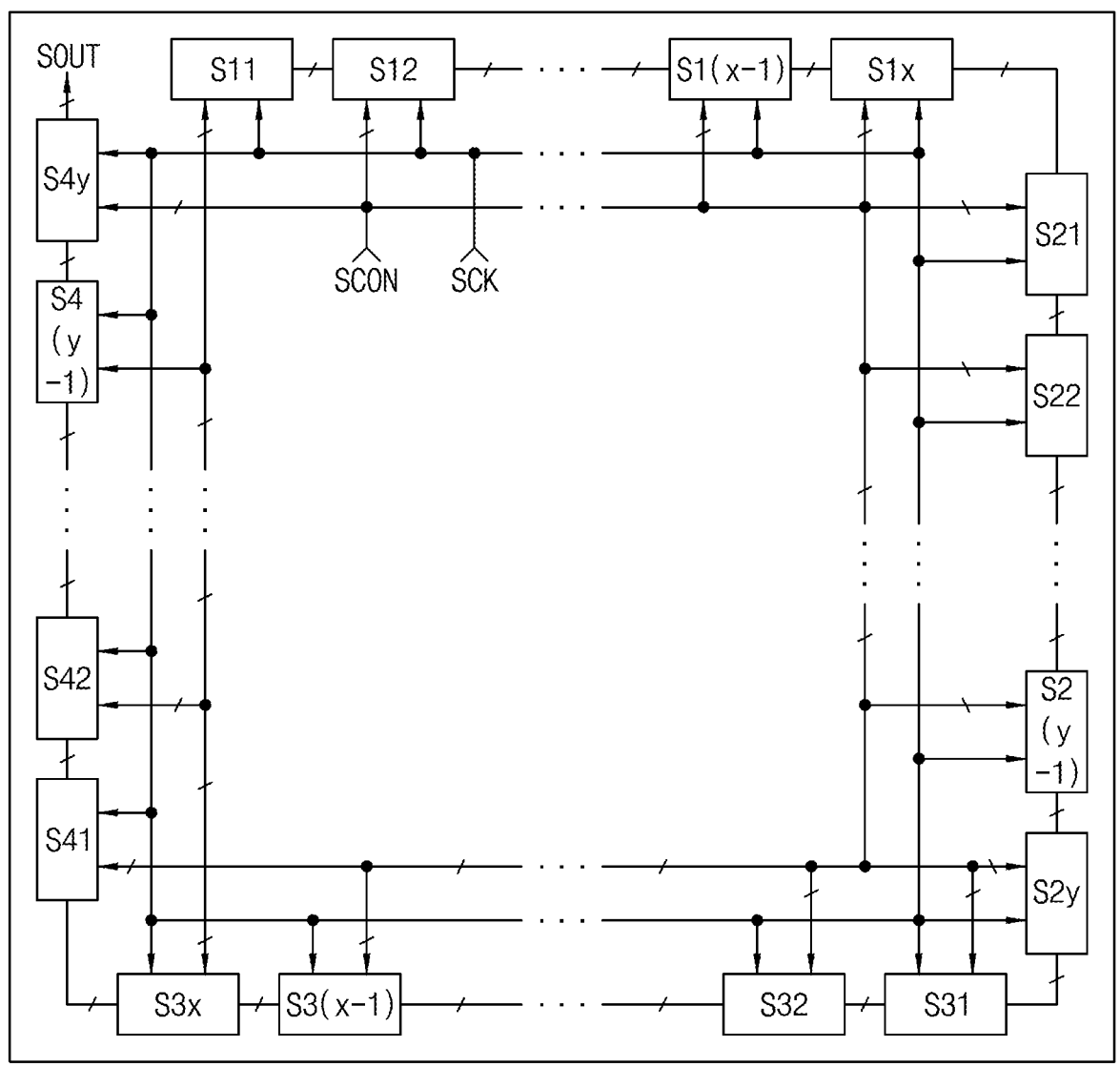
FIG. 1 is a block diagram of an integrated circuit device according to some embodiments of the inventive concept.

The inventive concept will now be described more fully with reference to the accompanying drawings, in which example embodiments of the inventive concept are shown. Like reference numerals may refer to like elements throughout this description. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a block diagram of an integrated circuit device according to some embodiments of the inventive concept. An integrated circuit device 100 may include warpage detection sensors S11 to S1$x$, S21 to S2$y$, S31 to S3$x$, and S41 to S4$y$.

Referring to the plan view of the integrated circuit device 100 shown in FIG. 1, the warpage detection sensors S11 to S1$x$ may be disposed on an upper side of an outer portion of the integrated circuit device 100 so as to be electrically connected to each other in series, the warpage detection sensors S21 to S2$y$ may be disposed on a right side of the outer portion of the integrated circuit device 100 so as to be electrically connected to each other in series, the warpage detection sensors S31 to S3$x$ may be disposed on a lower side of the outer portion of the integrated circuit device 100 so as to be electrically connected to each other in series, and the warpage detection sensors S41 to S4$y$ may be disposed on a left side of the outer portion of the integrated circuit device 100 so as to be electrically connected to each other in series. That is, the warpage detection sensors S11 to S4y may be disposed on the outer portion of the integrated circuit device 100 so as to be connected to each other in series.

Each of the warpage detection sensors S11 to S4y may generate and store a warpage value (e.g., digital data with a predetermined number of bits) at a corresponding position in response to a switching control signal SCON and may shift the stored warpage value to generate a warpage output signal SOUT in response to the switching control signal SCON and a shifting clock signal SCK. The switching control signal SCON and the shifting clock signal SCK may be applied from an external test device outside of the integrated circuit device 100 (not shown) or may be internally generated in the integrated circuit device 100 in response to a test signal (not shown) applied from the test device. The warpage output signal SOUT may be output to the external test device and used by the test device as a signal for determining warpage or may be generated as a signal for internally determining warpage.

In other embodiments of the inventive concept, the warpage detection sensors S11 to S4y may be disposed at other positions rather than at the outer portion of the integrated circuit device 100.

Figure 2:
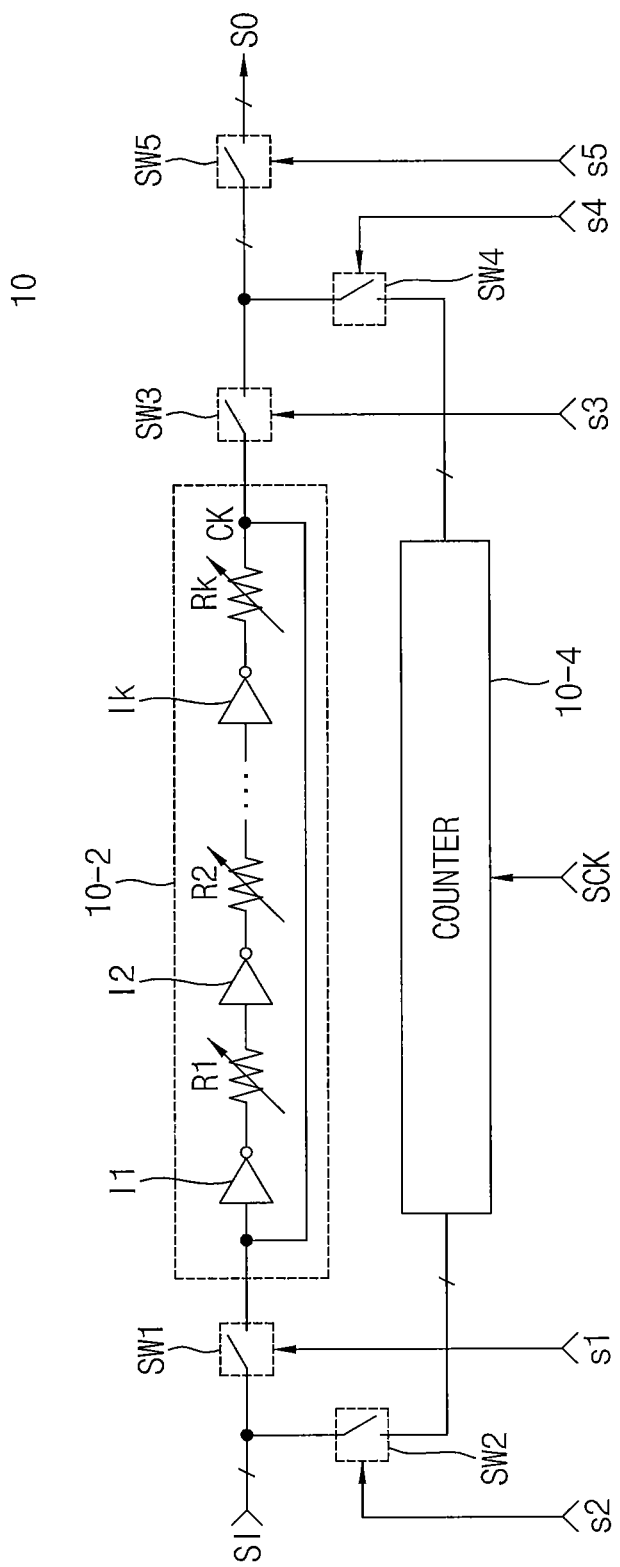
FIG. 2 is a diagram showing a configuration of a warpage detection sensor according to some embodiments of the inventive concept.

FIG. 2 is a diagram showing a configuration of a warpage detection sensor according to some embodiments of the inventive concept. A warpage detection sensor 10 may include a clock generator 10-2, a counter 10-4, and first to fifth switches SW1 to SW5. The clock generator 10-2 may include first to $k^{th}$ inverters I1 to Ik and first to $k^{th}$ resistors R1 to Rk. The clock generator 10-2 may be a ring oscillator in which the first to $k^{th}$ inverters I1 to Ik and the first to $k^{th}$ resistors R1 to Rk are alternately electrically connected in series in a ring shape. Here, k may be a natural number, which is an odd number. Each of the first to $k^{th}$ resistors R1 to Rk may be a piezoelectric resistive element, may have a resistance which varies based on a pressure, and may be formed of polysilicon.

Functionality of each of the blocks shown in FIG. 2 will now be described.

First, first switching control signals s1 to s5 may be generated, and first, third, and fourth switches SW1, SW3, and SW4 may be turned on (i.e., closed) in response to first, third, and fourth switching signals s1, s3, and s4 and second and fifth switches SW2 and SW5 may be turned off (i.e., opened) in response to second and fifth switching signals s2 and s5.

In this case, the clock generator 10-2 may generate a clock signal CK. When the first to $k^{th}$ resistors R1 to Rk of the clock generator 10-2 increase in pressure due to warpage, resistances thereof may increase and a period of the clock signal CK may increase. Therefore, the resistances of the first to $k^{th}$ resistors R1 to Rk of the clock generator 10-2 may vary based on the pressure during a period in which the first, third, and fourth switches SW1, SW3, and SW4 are turned on so that the clock generator 10-2 may generate the clock signal CK including a predetermined number of clock cycles. The counter 10-4 may perform a counting operation to generate digital data with a predetermined number of bits as a warpage value in response to the predetermined number of clock cycles included in the clock signal CK. For example, when the number of bits is three and the number of clock cycles is three, the counter 10-4 may generate 3-bit digital data, "011," as a warpage value.

Next, second switching control signals s1 to s5 may be generated, and the first and third switches SW1 and SW3 may be turned off (i.e., opened) in response to the first and third switching signals s1 and s3 and the second, fourth, and fifth switches SW2, SW4, and SW5 may be turned on (i.e., closed) in response to the second, fourth, and fifth switching signals s2, s4, and s5.

In this case, the counter 10-4 may shift and output the stored digital data with the predetermined number of bits in response to a shifting clock signal SCK. The counter 10-4 may output the stored digital data with the predetermined number of bits as output data SO in response to the shifting clock signal SCK and receive the digital data with the predetermined number of bits output from the counter 10-4 of the previous warpage detection sensor as input data SI. The counter 10-4 of each of the warpage detection sensors S11 to S4y shown in FIG. 1 may operate as a shift register, output the digital data with the predetermined number of bits stored in the counters 10-4 in parallel in response to the shifting clock signal SCK, and receive the digital data with the predetermined number of bits output from the counter 10-4 of the previous warpage detection sensor in parallel. In other embodiments, the counter 10-4 may receive and output the digital data with the predetermined number of bits one bit at a time, e.g., in serial fashion, without receiving and outputting the digital data with the predetermined number of bits in parallel in response to the shifting clock signal SCK.

Figure 3:
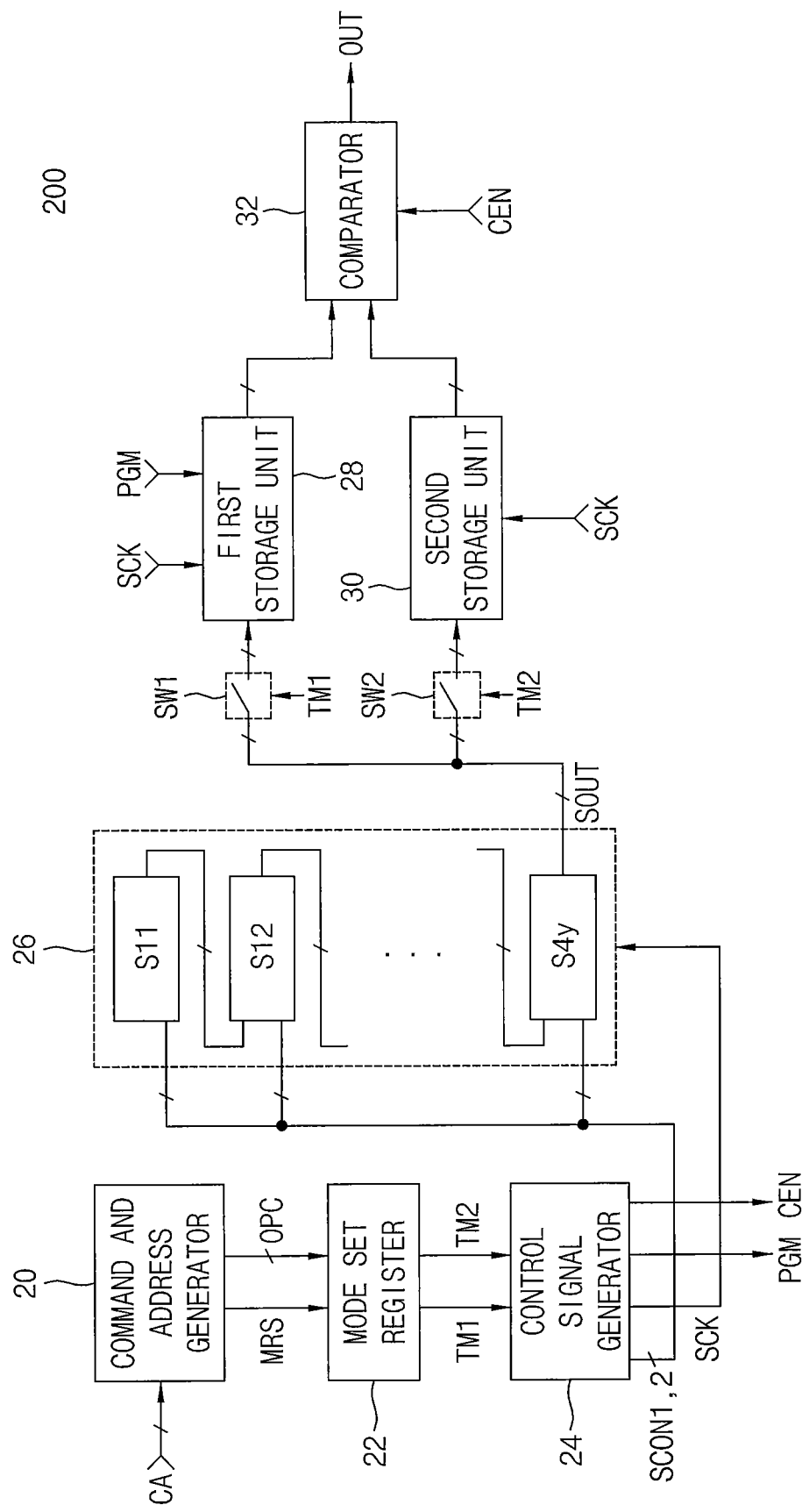
FIG. 3 is a block diagram of a semiconductor memory device according to some embodiments of the inventive concept.

FIG. 3 is a block diagram of a semiconductor memory device according to some embodiments of the inventive concept. A semiconductor memory device 200 may include a command and address generator 20, a mode set register 22, a control signal generator 24, warpage detection sensors (S11 to S4y) 26, a first storage unit 28, a second storage unit 30, a comparator 32, and first and second switches SW1 and SW2.

Functionality of each of the blocks shown in FIG. 3 will now be described.

The command and address generator 20 may receive a command and address CA to generate a mode set command MRS and a mode set code OPC. That is, the command and address generator 20 may decode a command signal included in the command and address CA to generate the mode set command MRS and may generate an address signal included in the command and address CA as the mode set code OPC.

The mode set register 22 may receive the mode set code OPC to generate a first test mode signal TM1 or a second test mode signal TM2 in response to the mode set command MRS.

The control signal generator 24 may generate a first switching control signal SCON1 for a first time period, generate a second switching control signal SCON2 and a shifting clock signal SCK for a second time period, and generate a program signal PGM for a third time period in response to the first test mode signal TM1. Further, the control signal generator 24 may generate the first switching control signal SCON1 for the first time period, generate the second switching control signal SCON2 and the shifting clock signal SCK for the second time period, and generate a comparative enable signal CEN for the third time period in response to the second test mode signal TM2. The first test mode signal TM1 may be generated when manufacturing the semiconductor memory device, and the second test mode signal TM2 may be generated when monitoring warpage of the semiconductor memory device.

The warpage detection sensors S11 to S4y may generate first digital data with a predetermined number of bits based on warpage in response to the first switching control signal SCON1 which is generated in response to the first test mode signal TM1 and shift the first digital data with the predetermined number of bits in parallel to generate the warpage output signal SOUT or shift and output the first digital data with the predetermined number of bits one bit at a time in contrast to that shown in the drawing in response to the second switching control signal SCON2 and the shifting clock signal SCK. Further, the warpage detection sensors S11 to S4y may generate second digital data with a predetermined number of bits based on warpage in response to the first switching control signal SCON1, which is generated in response to the second test mode signal TM2 and shift the second digital data with the predetermined number of bits in parallel to generate the warpage output signal SOUT or shift and output the second digital data with the predetermined number of bits one bit at a time (i.e., in serial fashion) in contrast with that shown in the drawing in response to the second switching control signal SCON2 and the shifting clock signal SCK.

The first switch SW1 may be turned on in response to the first test mode signal TM1, and the second switch SW2 may be turned on in response to the second test mode signal TM2.

The first storage unit 28 may program the warpage output signal SOUT in response to the program signal PGM. In other embodiments, the first storage unit 28 may store the warpage output signal SOUT in response to the shifting clock signal SCK and program the warpage output signal SOUT in response to the program signal PGM.

The second storage unit 30 may store the warpage output signal SOUT in response to the shifting clock signal SCK.

The comparator 32 may calculate a difference value between the warpage output signal SOUT programmed in the first storage unit 28 and the warpage output signal SOUT stored in the second storage unit 30 in response to the comparative enable signal CEN. When the difference value is greater than or equal to a predetermined value, the comparator 32 may generate an output signal OUT indicating a fail.

The warpage output signal SOUT may be programmed in the first storage unit 28 when manufacturing the semiconductor memory device 200 shown in FIG. 3 before any warpage occurs, and the warpage output signal SOUT programmed in the first storage unit 28 may be a warpage output signal SOUT in the case in which there is no warpage. Further, the warpage output signal SOUT may be stored in the second storage unit 30 when monitoring the warpage of the semiconductor memory device 200, and the warpage output signal SOUT stored in the second storage unit 30 may be a warpage output signal SOUT in the case in which there is no warpage or in the case in which there is warpage. When the difference value between the warpage output signal SOUT programmed in the first storage unit 28 and the warpage output signal SOUT stored in the second storage unit 30 is less than the predetermined value, it may be determined that there is no warpage, and when the difference value is greater than or equal to the predetermined value, it may be determined that there is warpage.

Figure 4:
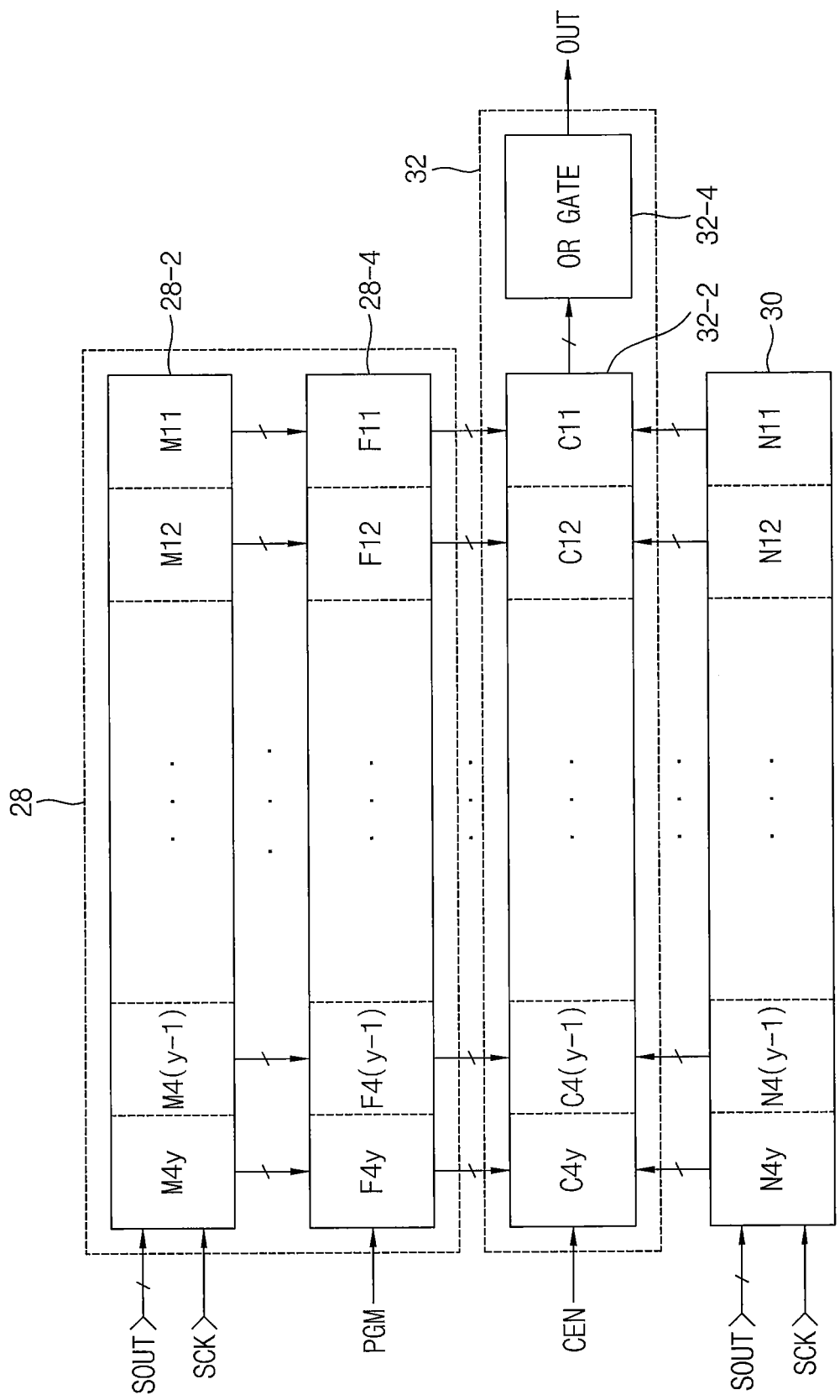
FIG. 4 is a diagram showing a configuration of a first storage unit, a second storage unit, and a comparator according to some embodiments of the inventive concept.

FIG. 4 is a diagram showing a configuration of the first storage unit 28, the second storage unit 30, and the comparator 32 according to some embodiments of the inventive concept. The first storage unit 28 may include a first register 28-2 and a fuse circuit unit 28-4, the comparator 32 may include a difference value calculator 32-2 and an OR gate 32-4, and the second storage unit 30 may be a second register. The first register 28-2 may include a plurality of first sub-registers M11 to M4y, the fuse circuit unit 28-4 may include a plurality of sub-fuse circuit units F11 to F4y, the second register 30 may include a plurality of second sub-registers N11 to N4y, and the difference value calculator 32-2 may include a plurality of sub-difference value calculation units C11 to C4y.

Functionality of each of the blocks shown in FIG. 4 will now be described.

The plurality of first sub-registers M11 to M4y may respectively store the first digital data with the predetermined number of bits output from the plurality of warpage detection sensors S11 to S4y.

The plurality of sub-fuse circuit units F11 to F4y may respectively program the first digital data with the predetermined number of bits output from the plurality of first sub-registers M11 to M4y in response to the program signal PGM.

The plurality of second sub-registers N11 to N4y may respectively store the second digital data with the predetermined number of bits output from the plurality of warpage detection sensors S11 to S4y.

The plurality of sub-difference value calculation units C11 to C4y may calculate a difference value between the first digital data with the predetermined number of bits programmed in each of the plurality of sub-fuse circuit units F11 to F4y and the second digital data with the predetermined number of bits stored in each of the plurality of second sub-registers N11 to N4y in response to the comparative enable signal CEN. When the difference values are greater than or equal to a predetermined value, each of the plurality of sub-difference value calculation units C11 to C4y may generate a signal indicating a fail, and when the difference values are less than the predetermined value, each of the plurality of sub-difference value calculation units C11 to C4y may generate a signal indicating a pass.

When at least one of the difference values indicates a fail signal, the OR gate 32-4, which may perform a logical OR operation on the fail/pass signals output from the sub-difference value calculation units C11 to C4y, may generate an output signal OUT indicating a fail.

In other embodiments of the inventive concept, the semiconductor memory device may not include the OR gate 32-4. In this case, the signal indicating a fail or a pass output from each of the plurality of sub-difference value calculation units C11 to C4y may be output. The external test device (not shown) may determine a position where warpage occurs using the signals output from the plurality of sub-difference value calculation units C11 to C4y. For example, when the signal output from the sub-difference value calculator C1x indicates a fail, it may be determined that warpage occurs at a position where the warpage detection sensor S1x is disposed.

In still other embodiments of the inventive concept, the semiconductor memory device may not include the OR gate 32-4, and the signal output from each of the plurality of sub-difference value calculation units C11 to C4y may be a difference value between the first digital data with the predetermined number of bits and the second digital data with the predetermined number of bits. In this case, the external test device (not shown) may determine a degree of warpage as well as the position where the warpage occurs using the signals output from the plurality of sub-difference value calculation units C11 to C4y. For example, when the difference value output from the sub-difference value calculator C1x is greater than the difference value output from the sub-difference value calculator C4y, it may be determined that a degree of warpage that occurs at a position where the warpage detection sensor S1x is disposed is greater than a degree of warpage which occurs at a position where the warpage detection sensor S4y is disposed.

Figure 5:
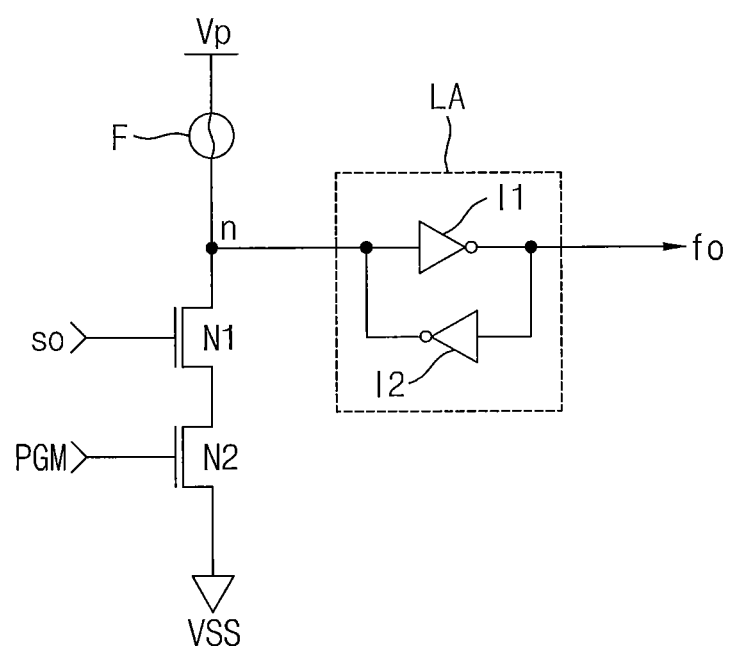
FIG. 5 is a circuit diagram showing a configuration of a fuse circuit unit according to some embodiments of the inventive concept.

FIG. 5 is a circuit diagram showing a configuration of a unit fuse circuit of the fuse circuit unit according to some embodiments of the inventive concept. The unit fuse circuit of the fuse circuit unit 28-4 may include a fuse F, a first n-channel metal-oxide-semiconductor (NMOS) transistor N1, a second NMOS transistor N2, and a latch LA. The latch LA may include first and second inverters I1 and I2. The unit fuse circuit of the fuse circuit unit 28-4 shown in FIG. 5 shows a configuration for programming one bit of data.

Operation of the unit fuse circuit of the fuse circuit unit 28-4 shown in FIG. 5 will now be described.

When the program signal PGM is a high-level signal and a signal so output from the first register 28-2 is a high-level signal, the first and second NMOS transistors N1 and N2 may be turned on. In this case, a high voltage VP may be applied to the fuse F so that the fuse F may be disconnected or opened. As a result, a low-level signal may be generated at a node n. The latch LA may invert and latch the low-level signal at the node n and generate a high-level signal fo.

Conversely, when the program signal PGM is a high-level signal and the signal so output from the first register 28-2 is a low-level signal, the first NMOS transistors N1 may be turned off and the second NMOS transistor N2 may be turned on. In this case, the fuse F may remain in a connected state or intact state. As a result, a high-level signal may be generated to the node n. The latch LA may invert and latch the high-level signal at the node n and generate a low-level signal fo.

Figure 6:
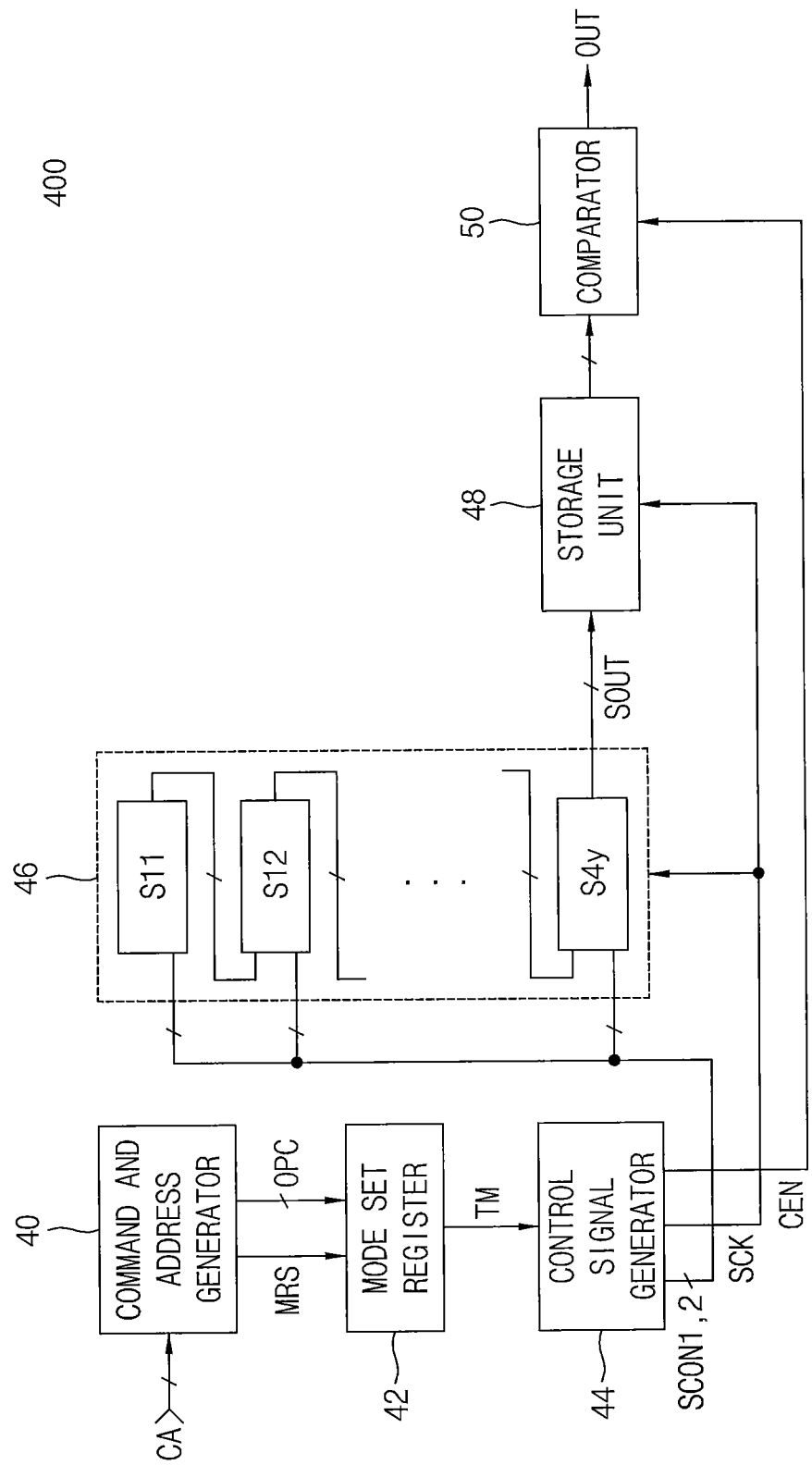
FIG. 6 is a block diagram of a semiconductor memory device according to some embodiments of the inventive concept.

FIG. 6 is a block diagram of a semiconductor memory device according to some embodiments of the inventive concept. A semiconductor memory device 400 may include a command and address generator 40, a mode set register 42, a control signal generator 44, warpage detection sensors (S11 to S4y) 46, a storage unit 48, and a comparator 50.

Functionality of each of the blocks shown in FIG. 6 will now be described.

The command and address generator 40 may perform the same or similar function as the command and address generator 20 shown in FIG. 3.

The mode set register 42 may receive a mode set code OPC to generate a test mode signal TM in response to a mode set command MRS in contrast with the mode set register 22 shown in FIG. 3.

The control signal generator 44 may generate a first switching control signal SCON1 for a first period, generate a second switching control signal SCON2 and a shifting clock signal SCK for a second period, and generate a comparative enable signal CEN for a third period in response to the test mode signal TM. The test mode signal TM may be generated when monitoring warpage of the semiconductor memory device.

The warpage detection sensors S11 to S4y may generate digital data with a predetermined number of bits according to warpage in response to the first switching control signal SCON1, which is generated in response to the test mode signal TM, and shift the digital data with the predetermined number of bits in parallel to generate a warpage output signal SOUT or shift and output the digital data with the predetermined number of bits one bit at a time, e.g., in serial fashion, in contrast to that shown in the drawing, in response to the second switching control signal SCON2 and the shifting clock signal SCK.

The storage unit 48 may store the warpage output signal SOUT in response to the shifting clock signal SCK.

The comparator 50 may calculate a difference value between the digital data with the predetermined number of bits generated from the warpage detection sensors S11 to S4y adjacent to each other in response to the comparative enable signal CEN. When the difference value is greater than or equal to a predetermined value, the comparator 50 may generate an output signal OUT indicating a fail, and when the difference value is less than the predetermined value, the comparator 50 may generate an output signal OUT indicating a pass.

While monitoring the warpage of the semiconductor memory device 400 shown in FIG. 6, when the difference value between the digital data with the predetermined number of bits generated from two adjacent warpage detection sensors is less than the predetermined value, it may be determined that there is no warpage, and when the difference value is greater than or equal to the predetermined value, it may be determined that there is warpage.

Figure 7:
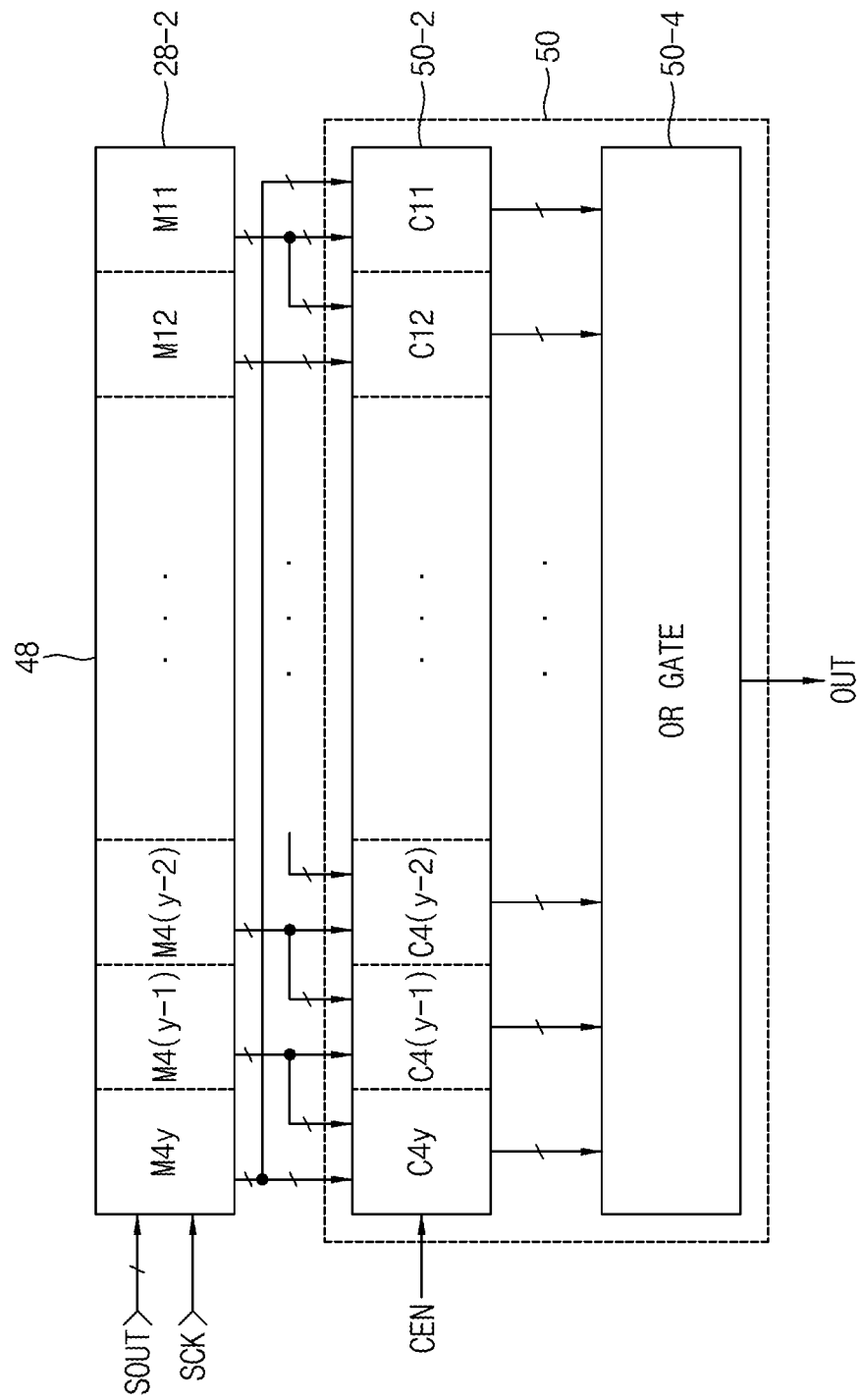
FIG. 7 is a diagram showing a configuration of a storage unit and a comparator according to some embodiments of the inventive concept.

FIG. 7 is a diagram showing a configuration of the storage unit 48 and the comparator 50 according to some embodiments of the inventive concept. The storage unit 48 may include a plurality of sub-registers M11 to M4y, and the comparator 50 may include a difference value calculator 50-2 and an OR gate 50-4. The difference value calculator 50-2 may include a plurality of sub-difference value calculation units C11 to C4y.

Functionality of each of the blocks shown in FIG. 7 will now be described.

The plurality of sub-registers M11 to M4y may respectively store digital data with a predetermined number of bits output from the plurality of warpage detection sensors S11 to S4y.

The plurality of sub-difference value calculators C11 to C4y may calculate a difference value between two adjacent pieces of digital data with the predetermined number of bits output from the plurality of sub-registers M11 to M4y in response to the comparative enable signal CEN. When the difference value is greater than or equal to a predetermined value, each of the plurality of sub-difference value calculators C11 to C4y may generate a signal indicating a fail, and when the difference value is less than the predetermined value, each of the plurality of sub-difference value calculators C11 to C4y may generate a signal indicating a pass.

When at least one of the difference values is a signal indicating a fail, the OR gate 50-4 may generate an output signal OUT indicating the fail by performing a logical OR operation on the pass/fail signals output from the plurality of sub-difference value calculators C11 to C4y.

In other embodiments of the inventive concept, the semiconductor memory device may not include the OR gate 50-4. In this case, the signal indicating the fail or the pass output from each of the plurality of sub-difference value calculation units C11 to C4y may be output. The external test device (not shown) may determine a position where warpage occurs using the signals output from the plurality of sub-difference value calculation units C11 to C4y. For example, when the signal output from the sub-difference value calculator C1x indicates the fail, it may be determined that warpage occurs at a position where the warpage detection sensor S1x or S(x−1) is disposed.

In still other embodiments of the inventive concept, the semiconductor memory device may not include the OR gate 50-4, and the signal output from each of the plurality of sub-difference value calculation units C11 to C4y may be a difference value between two adjacent pieces of digital data with the predetermined number of bits. In this case, the external test device (not shown) may determine a degree of warpage as well as the position where the warpage occurs using the signals output from the plurality of sub-difference value calculation units C11 to C4y. For example, when the difference value output from the sub-difference value calculator C1x is greater than the difference value output from the sub-difference value calculator C4y, it may be determined that a degree of warpage at a position where the warpage detection sensor S1(x−1) or S1x is disposed is greater than a degree of warpage at a position where the warpage detection sensor S4(y−1) or S4y is disposed.

Figure 8:
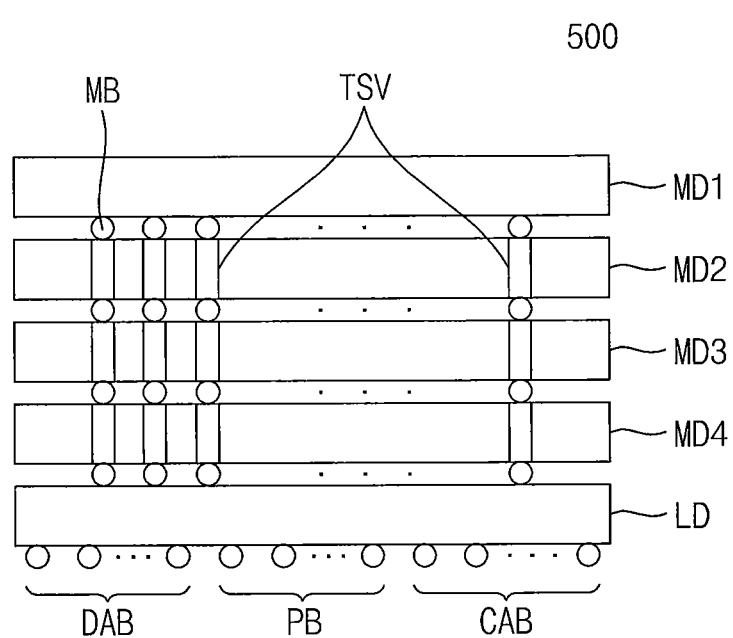
FIG. 8 is a diagram showing a high bandwidth memory device according to some embodiments of the inventive concept.

FIG. 8 is a diagram showing a high bandwidth memory device according to some embodiments of the inventive concept. A high bandwidth memory device 500 may include memory dies MD1 to MD4 and a logic die LD. The memory dies MD1 to MD4 and the logic die LD may be stacked, and the stacked memory dies MD1 to MD4 may be stacked on the logic die LD. Bumps MB may be formed between the stacked memory dies MD1 to MD4 and the logic die BD, and through-silicon vias (TSVs) passing through the memory dies MD1 to MD4 may be formed between the bumps MB. Direct access (DA) bumps DAB, power bumps PB, and command and address bumps and data bumps CAB may be disposed on a lower surface of the logic die LD.

Figure 9:
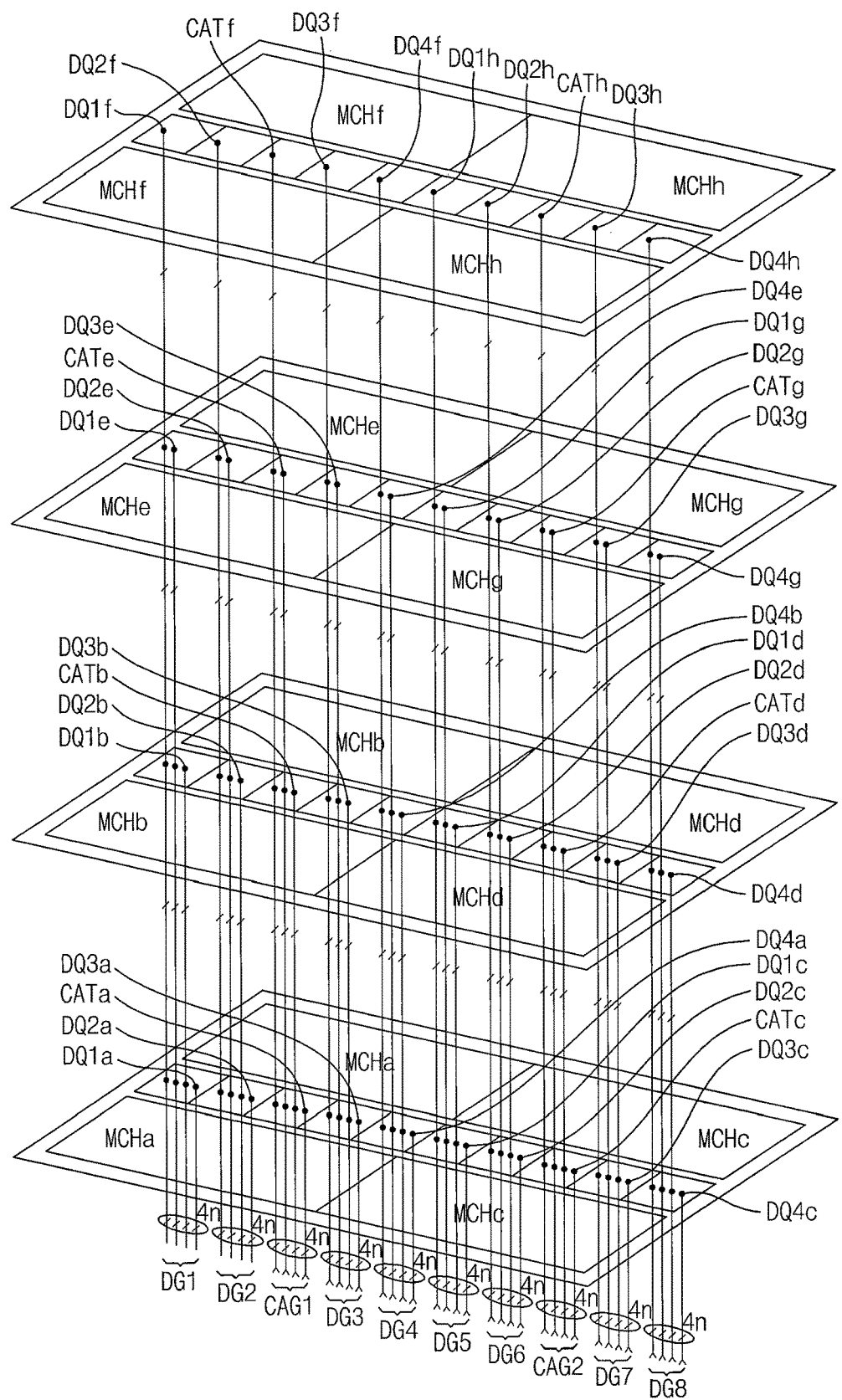
FIG. 9 is a diagram showing a configuration of memory dies according to some embodiments of the inventive concept.

FIG. 9 is a diagram showing a configuration of the memory dies MD1 to MD4 according to some embodiments of the inventive concept. The memory dies MD1 to MD4 may include two memory channels (MCHa and MCHc), (MCHb and MCHd), (MCHe and MCHg), and (MCHf and MCHh), respectively, and each of the memory channels MCHa to MCHh may include a predetermined number of memory banks (not shown). The memory channels MCHa, MCHb, MCHe, and MCHf may be respectively disposed on left sides of the memory dies MD1 to MD4, and the memory channels MCHc, MCHd, MCHg, and MCHh may be respectively disposed on right sides of the memory dies MD1 to MD4. The respective memory channels MCHa to MCHh may be disposed so as to be vertically separated from each other in the corresponding memory dies MD1 to MD4. Corresponding data terminals (DQ1$a$ to DQ4$a$), (DQ1$b$ to DQ4$b$), (DQ1e to DQ4$e$), and (DQ1$f$ to DQ4$f$)) and corresponding command and address terminals CATa, CATb, CATe, and CATf may be included between the respective memory channels MCHa, MCHb, MCHe, and MCHf, which are vertically separated from each other, and corresponding data terminals (DQ1$c$ to DQ4$c$), (DQ1$d$ to DQ4$d$), (DQ1$g$ to DQ4$g$), and (DQ1$h$ to DQ4$h$) and corresponding command and address terminals CATc, CATd, CATg, and CATh may be included between the respective memory channels MCHc, MCHd, MCHg, and MCHh, which are vertically separated from each other. A first data group DG1 may be transmitted through the data terminals DQ1$a$, DQ1$b$, DQ1$e$, and DQ1$f$, and a second data group DG2 may be transmitted through the data terminals DQ2$a$, DQ2$b$, DQ2$e$, and DQ2$f$. In this manner, third to eighth data groups DG3 to DG8 may be transmitted through the data terminals DQ3$a$ to DQ4$h$. A first command and address group CAG1 may be transmitted through the command and address terminals CATa, CATb, CATe, and CATf, and a second command and address group CAG2 may be transmitted through the command and address terminals CATc, CATd, CATg, and CATh.

In FIG. 9, the data terminals and the command and address terminals may be the bumps MB shown in FIGS. 1 and 2. Further, lines that vertically pass through the data terminals and the command and address terminals may be TSVs.

When it is assumed that n-bit data is input and output through each of the data terminals DQ1$a$ to DQ4$a$, . . . , and DQ1$h$ to DQ4$h$, a total of 32n bits of data may be input and output through all of the data terminals. When it is assumed that a k-bit command and address is input and output through each of the command and address terminals CATa to CATh, a total of 8 k bits of the command and address may be input and output through all of the command and address terminals.

In FIG. 9, the lines corresponding to the second to eighth data groups DG2 to DG8 may be configured to be the same as the lines corresponding to the first data group DG1, and the lines corresponding to the second command and address group CAG2 may be configured to be the same as the lines corresponding to the first command and address group CAG1.

In other embodiments, each of the memory dies MD1 to MD4 shown in FIG. 9 may include one or more of the configurations described with reference to FIGS. 1 to 7.

FIG. 10 is a diagram showing a configuration of the logic die LD according to some embodiments of the inventive concept. The logic die LD may include a physical (PHY) unit 60, a TSV circuit unit 62, a DA circuit unit 64, and a DA buffer unit 66. The DA buffer unit 66 may include a test clock signal (TCK) input buffer 66-2, a test command and address (TCA) input buffer 66-4, and a test data (TDQ) input and output buffer 66-6. The PHY unit 60 may include channel PHY units PHYa to PHYh for receiving a channel clock signal and a channel command and address and for receiving and outputting channel data, which are for each of the memory channels MCHa to MCAh. Each of the channel PHY units PHYa to PHYh may include a buffer unit 60-2 and a selection unit 60-4. Each buffer unit 60-2 may include a clock signal (CK) input buffer 60-22, a command and address input buffer 60-24, and a data (DQ) input and output buffer 60-26.

Functionality of each of the blocks shown in FIG. 10 will now be described.

When a DA enable signal DAEN is deactivated in a normal mode, each of the channel PHY units PHYa to PHYh may receive corresponding channel clock signals CKa to CKh, corresponding channel commands and addresses CAa to CAh, and corresponding channel data DQa to DQh, which are received from an external control unit (not shown) (e.g., a graphic processing unit (GPU) die, a central processing unit (CPU) die, or a system-on-chip (SoC) die, or the like) through the command and address bumps and data bumps CAB, and output corresponding clock signals cka to ckh, corresponding commands and addresses caa to cah, and corresponding data dqa to dqh or may receive the corresponding data dqa to dqh and output the corresponding channel data DQa to DQh. Further, when the DA enable signal DAEN is activated in a DA test mode, each of the channel PHY units PHYa to PHYh may receive corresponding channel test clock signals tcka to tckh, corresponding channel test commands and addresses tcaa to tcah, and corresponding channel test data tdqa to tdqh and output corresponding clock signals cka to ckh, corresponding commands and addresses caa to cah, and corresponding data dqa to dqh or may receive the corresponding data dqa to dqh and output the corresponding channel test data tdqa to tdqh. Further, when the DA enable signal DAEN is activated when monitoring the warpage, each of the channel PHY units PHYa to PHYh may receive the channel test clock signals tcka, tckb, tcke, and tckf or tckc, tckd, tckg, and tckh and the channel commands and addresses tcaa, tcab, tcae, and tcaf or tcac, tcad, tcag, and tcah and output the clock signals cka, ckb, cke, and ckf or ckc, ckd, ckg, and ckh and the commands and addresses caa, cab, cae, and caf or cac, cad, cag, and cah or may receive the data dqa, dqb, dqe, and dqf or dqc, dqd, dqg, and dqh and output the test data tdqa, tdqb, tdqe, and tdqf or tdqc, tdqd, tdqg, and tdqh. In this case, the test data tdqa, tdqb, tdqe, and tdqf or tdqc, tdqd, tdqg, and tdqh may be the difference values described with reference to FIGS. 1 to 7 or may be the output signal OUT generated using the difference values.

The clock signal input buffer 60-22 of each of the channel PHY units PHYa to PHYh may buffer the corresponding channel clock signals CKa to CKh to generate corresponding buffered channel clock signals ckba to ckbh. The command and address input buffer 60-24 may buffer the corresponding channel command and address CAa to CAh to generate corresponding buffered channel command and address caba to cabh. The data input buffer 60-26 may buffer the corresponding channel data DQa to DQh to generate corresponding buffered channel data dqba to dqbh or may receive the corresponding buffered channel data dqba to dqbh output from the selection unit 60-4 to generate corresponding channel data DQa to DQh.

When the DA enable signal DAEN is deactivated, the selection unit 60-4 of each of the channel PHY units PHYa to PHYh may select the corresponding buffered channel clock signals ckba to ckbh, the corresponding buffered channel command and address caba to cabh, and the corresponding buffered channel data dqba to dqbh and transmit the corresponding buffered channel clock signals ckba to ckbh, the corresponding buffered channel command and address caba to cabh, and the corresponding buffered channel data dqba to dqbh as the corresponding clock signals cka to ckh, the corresponding commands and addresses caa to cah, and the corresponding data dqa to dqh. When the DA enable signal DAEN is activated in the DA test mode, the selection unit 60-4 of each of the channel PHY units PHYa to PHYh may transmit the corresponding channel test clock signals tcka to tckh, the corresponding channel test commands and addresses tcaa to tcah, and the corresponding channel test data tdqa to tdqh as the corresponding clock signals cka to ckh, the corresponding commands and addresses caa to cah, and the corresponding data dqa to dqh. Further, when the DA enable signal DAEN is activated when monitoring the warpage, the selection unit 60-4 of each of the channel PHY units PHYa to PHYh may receive the channel test clock signals tcka, tckb, tcke, and tckf or tckc, tckd, tckg, and tckh and the channel commands and addresses tcaa, tcab, tcae, and tcaf or tcac, tcad, tcag, and tcah and output the clock signals cka, ckb, cke, and ckf or ckc, ckd, ckg, and ckh and the commands and addresses caa, cab, cae, and caf or cac, cad, cag, and cah and may receive the data dqa, dqb, dqe, and dqf or dqc, dqd, dqg, and dqh and output the test data tdqa, tdqb, tdqe, and tdqf or tdqc, tdqd, tdqg, and tdqh. In addition, the selection unit 60-4 of each of the channel PHY units PHYa to PHYh may transmit the corresponding data dqa to dqh as the corresponding buffered channel data dqba to dqbh when the DA enable signal DAEN is deactivated, may transmit the corresponding data dqa to dqh as the corresponding channel test data tdqa to tdqh when the DA enable signal DAEN is activated in the DA test mode, and may transmit the data dqa, dqb, dqe, and dqf or dqc, dqd, dqg, and dqh as the test data tdqa, tdqb, tdqe, and tdqf or tdqc, tdqd, tdqg, and tdqh when the DA enable signal DAEN is activated when monitoring the warpage. The test data tdqa, tdqb, tdqe, and tdqf or tdqc, tdqd, tdqg, and tdqh may be the difference values described with reference to FIGS. 1 to 7 or may be the output signal OUT generated using the difference values.

The TSV circuit unit 62 may align the clock signals cka to ckh, the commands and addresses caa to cah, and the data dqa to dqh, which are output from the PHY units PHYa to PHYh, and generate first to eighth data groups DG1 to DG8 and first and second command and address groups CAG1 and CAG2.

The test clock signal input buffer 66-2 may buffer a test clock signal TCK and generate a buffered test clock signal tckbu. The test command and address input buffer 62-4 may buffer a test command and address TCA and generate a buffered test command and address tcabu. The test data input and output buffer 66-6 may buffer test data TDQ and generate a buffered test data tdqbu or output the buffered test data tdqbu to the outside.

When the DA enable signal DA is activated in the DA test mode, the DA circuit unit 64 may receive the buffered test clock signal tckbu, the buffered test command and address tcabu, and the buffered test data tdqbu and output the corresponding channel test clock signals tcka to tckh, the corresponding channel test commands and addresses tcaa to tcah, and the corresponding channel test data tdqa to tdqh to the selection unit 60-4 of each of the PHY units PHYa to PHYh or may receive the corresponding channel test data tdqa to tdqh output from the selection unit 50-4 of each of the PHY units PHYa to PHYh and generate the buffered test data tdqbu. When the buffered test clock signal tckb, the buffered test command and address tcab, and the buffered test data tdqb are respectively composed of 1, k, and n bits, the DA circuit unit 64 may extend each of one buffered test clock signal tckbu, a k-bit buffered test command and address tcabu, and an n-bit buffered test data tdqbu and generate eight channel test clock signals tcka to tckh, eight k-bit channel test commands and addresses tcaa to tcah, and eight pieces of 32n-bit channel test data tdqa to tdqh. When the DA circuit unit 64 receives eight 32n-bit test data tdqa to tdqh from the selection unit 50-4, the DA circuit unit 64 may compare the previously input n-bit buffered test data tdqb and the eight pieces of 32n-bit channel test data tdqa to tdqh by n-bit and output a comparison result as the buffered test data tdqbu. When the DA enable signal DAEN is activated when monitoring the warpage, the DA circuit unit 64 may receive one buffered test clock signal tckbu and a k-bit buffered test command and address tcabu and generate four buffered test clock signals tcka, tckb, tcke, and tckf or tckc, tckd, tckg, and tckh and four k-bit test commands and addresses tcaa, tcab, tcae, and tcaf or tcac, tcad, tcag, and tcah and may receive four pieces of test data tdqa, tdqb, tdqe, and tdqf or tdqc, tdqd, tdqg, and tdqh and generate the buffered test data tdqbu. The four pieces of test data tdqa, tdqb, tdqe, and tdqf or tdqc, tdqd, tdqg, and tdqh may be the difference values described with reference to FIGS. 1 to 7 or may be the output signal OUT generated using the difference values.

When the DA enable signal DAEN is activated in the DA test mode, the logic die LD shown in FIG. 10 may receive a test channel clock signal TCK, a test channel command and address TCA, and a test channel data TDQ, which are applied through the DA bumps DAB and generate the first to eighth data groups DG1 to DG8 and the first and second command and address groups CAG1 and CAG2 or may receive the first to eighth data groups DG1 to DG8 and generate the test data TDQ. Further, when the DA enable signal DAEN is activated when monitoring the warpage, the logic die LD may receive the test channel clock signal TCK and the test channel command and address TCA and output four memory dies MD1 to MD4 and may receive four pieces of test data tdqa, tdqb, tdqe, and tdqf or tdqc, tdqd, tdqg, and tdqh output from the plurality of memory dies MD1 to MD4 and generate the test data TDQ. In this case, the generated test data TDQ may be the difference values described with reference to FIGS. 1 to 7 or may be the output signal OUT generated using the difference values.

In other embodiments, the logic die LD may also include the configuration as described with reference to FIGS. 1 to 7 and may output the difference values or the output signal OUT generated using the difference value through the DA bumps DAB.

In other embodiments, the high bandwidth memory device shown in FIG. 8 may be included in a 2.5-dimensional (D) system device or a 3D system device. In this case, a warpage-monitoring operation may be performed before the integrated circuit device mounted on an interposer or a control unit of a system device so that it may be determined whether there is a defect due to the warpage before such incorporation into another device, system, or product.

According to some embodiments of the inventive concept, an integrated circuit device and/or a high bandwidth memory device can externally identify defects caused by the warpage. As a result, the reliability of the device can be improved.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. An integrated circuit device, comprising:
a plurality of warpage detection sensors at a plurality of different positions, respectively, and electrically connected in series,
wherein each of the plurality of warpage detection sensors is configured to generate a clock signal with a period that is based on a resistance that varies based on a pressure at a corresponding one of the plurality of different positions, and is further configured to generate first digital data by performing a first counting operation in response to the clock signal and to generate second digital data by performing a second counting operation in response to the clock signal.

2. The integrated circuit device of claim 1, wherein each of the plurality of warpage detection sensors comprises:
a clock generator configured to generate the clock signal; and
a counter configured to generate the first digital data or the second digital data by performing the first counting operation or the second counting operation in response to the clock signal, to output the first digital data or the second digital to a next warpage detection sensor in response to a shifting clock signal, and to receive the first digital data or the second digital data output from a previous warpage detection sensor.

3. The integrated circuit device of claim 2, wherein:
the plurality of warpage detection sensors are electrically connected in series on an outer portion of the integrated circuit device;
the clock generator is a ring oscillator comprising at least one inverter and at least one piezoelectric resistive element, which are alternately electrically connected in a ring; and
each of the at least one piezoelectric resistive element comprises polysilicon of which the resistance varies based on the pressure.

4. The integrated circuit device of claim 3, wherein the integrated circuit device is a semiconductor memory device, and
wherein the semiconductor memory device comprises:
a mode set register configured to generate a first test signal in a first test mode and to generate a second test signal in a second test mode;
a control signal generator configured to generate a first switching control signal for a first period, to generate a second switching control signal and the shifting clock signal for a second period, and to generate a program signal or a comparative enable signal for a third period in response to the first test signal or the second test signal;
a first storage unit configured to store the first digital data in response to the shifting clock signal and the program signal in the first test mode;
a second storage unit configured to store the second digital data in response to the shifting clock signal in the second test mode; and
a comparator configured to calculate difference values between the first digital data and the second digital data in response to the comparative enable signal in the second test mode.

5. The integrated circuit device of claim 4, wherein:
the first storage unit comprises a first register comprising a plurality of first sub-registers configured to respectively store the first digital data output from the plurality of warpage detection sensors; and a fuse circuit unit comprising a plurality of sub-fuse circuit units configured to respectively program the first digital data output from the plurality of first sub-registers in response to the program signal,
the second storage unit comprises a second register comprising a plurality of second sub-registers configured to respectively store the second digital data output from the plurality of warpage detection sensors, and
the comparator comprises a plurality of sub-difference value calculation units configured to calculate difference values between the first digital data programmed in the plurality of sub-fuse circuit units and the second digital data stored in the plurality of second sub-registers in response to the comparative enable signal.

6. An integrated circuit device, comprising:
a plurality of warpage detection sensors at a plurality of different positions and electrically connected in series,
wherein each of the plurality of warpage detection sensors is configured to generate a clock signal with a period that is based on a resistance that varies based on a pressure at a corresponding one of the plurality of positions, and to generate digital data by performing a counting operation in response to the clock signal.

7. The integrated circuit device of claim 6, wherein each of the plurality of warpage detection sensors comprises:
a clock generator configured to generate the clock signal; and
a counter configured to generate the digital data by performing the counting operation in response to the clock signal, to output the digital data to a next warpage detection sensor in response to a shifting clock signal, and to receive the digital data output from the previous warpage detection sensor.

8. The integrated circuit device of claim 7, wherein:
the plurality of warpage detection sensors are electrically connected in series on an outer portion of the integrated circuit device;

the clock generator is a ring oscillator comprising at least one inverter and at least one piezoelectric resistive element, which are alternately electrically connected in a ring; and each of the at least one piezoelectric resistive element comprises polysilicon of which the resistance varies based on the pressure.

9. The integrated circuit device of claim 8, wherein the integrated circuit device is a semiconductor memory device, wherein the semiconductor memory device comprises:

a mode set register configured to generate a test signal in a test mode;

a control signal generator configured to generate a first switching control signal for a first period, to generate a second switching control signal and the shifting clock signal for a second period, and to generate a comparative enable signal for a third period in response to the test signal;

a storage unit configured to store the digital data in response to the shifting clock signal in the test mode; and a comparator configured to calculate difference values between the digital data associated with ones of the plurality of warpage detection sensors adjacent to each other in the test mode.

10. The integrated circuit device of claim 9, wherein:

the storage unit comprises a register comprising a plurality of sub-registers configured to respectively store the digital data output from the plurality of warpage detection sensors; and the comparator comprises a plurality of sub-difference value calculation units configured to calculate difference values between the digital data associated with the ones of the plurality of warpage detection sensors adjacent to each other stored in the plurality of sub-registers in response to the comparative enable signal.

11. A high bandwidth memory device comprising:

a logic die; and a plurality of memory dies stacked on the logic die, wherein each of the plurality of memory dies comprises a plurality of warpage detection sensors at a plurality of different positions, respectively, and electrically connected in series, each of the plurality of warpage detection sensors being configured to generate a clock signal with a period that is based on a resistance that varies based on a pressure at a corresponding position, and to generate first digital data by performing a counting operation in response to the clock signal.

12. The high bandwidth memory device of claim 11, wherein each of the plurality of warpage detection sensors comprises:

a clock generator configured to generate the clock signal; and a counter configured to generate the first digital data by performing the counting operation in response to the clock signal, to output the first digital data to a next warpage detection sensor in response to a shifting clock signal, and to receive the first digital data output from the previous warpage detection sensor.

13. The high bandwidth memory device of claim 12, wherein:

the plurality of warpage detection sensors are electrically connected in series on an outer portion of each of the plurality of memory dies;

the clock generator is a ring oscillator comprising at least one inverter and at least one piezoelectric resistive element, which are alternately electrically connected in a ring shape; and each of the at least one piezoelectric resistive element comprises polysilicon of which the resistance varies based on the pressure.

14. The high bandwidth memory device of claim 13, wherein each of the plurality of memory dies comprises:

a mode set register configured to generate a test signal in a test mode;

a control signal generator configured to generate a first switching control signal for a first period, to generate a second switching control signal and the shifting clock signal for a second period, and to generate a comparative enable signal for a third period in response to the test signal;

a storage unit configured to store the first digital data in response to the shifting clock signal in the test mode; and a comparator configured to calculate difference values between the first digital data associated with ones of the plurality of warpage detection sensors adjacent to each other in response to the comparative enable signal in the test mode.

15. The high bandwidth memory device of claim 14, wherein each of the plurality of memory dies comprises:

at least one memory channel;

a clock signal terminal, command and address terminals, and data terminals; and through-silicon vias (TSVs) connected to the clock signal terminal, the command and address terminals, and the data terminals, wherein the logic die comprises direct access (DA) terminals, channel clock signal terminals, channel command and address terminals, and channel data terminals, and wherein the difference values or an output signal generated using the difference values are output through the DA terminals in the test mode.

16. The high bandwidth memory device of claim 11, wherein each of the plurality of warpage detection sensors is further configured to generate second digital data.

17. The high bandwidth memory device of claim 16, wherein each of the plurality of warpage detection sensors comprises:

a clock generator configured to generate the clock signal; and a counter configured to generate the first digital data or the second digital data by performing the counting operation in response to the clock signal, to output the first digital data or the second digital data to a next warpage detection sensor in response to the shifting clock signal, and to receive the first digital data or the second digital data output from the previous warpage detection sensor.

18. The high bandwidth memory device of claim 17, wherein:

the plurality of warpage detection sensors are electrically connected in series on an outer portion of the high bandwidth memory device;

the clock generator is a ring oscillator comprising at least one inverter and at least one piezoelectric resistive element, which are alternately electrically connected in a ring; and each of the at least one piezoelectric resistive element comprises polysilicon of which the resistance varies based on the pressure.

19. The high bandwidth memory device of claim 18, wherein each of the plurality of memory dies comprises:
a mode set register configured to generate a first test signal in a first test mode and to generate a second test signal in a second test mode;
a control signal generator configured to generate a first switching control signal for a first period, to generate a second switching control signal and the shifting clock signal for a second period, and to generate a program signal or a comparative enable signal for a third period in response to the first test signal or the second test signal;
a first storage unit configured to store the first digital data in response to the shifting clock signal and the program signal in the first test mode;
a second storage unit configured to store the second digital data in response to the shifting clock signal in the second test mode; and
a comparator configured to calculate difference values between the first digital data and the second digital data in response to the comparative enable signal in the second test mode.

20. The high bandwidth memory device of claim 19, wherein each of the plurality of memory dies comprises:
at least one memory channel;
a clock signal terminal, command and address terminals, and data terminals; and
through-silicon vias (TSVs) connected to the clock signal terminal, the command and address terminals, and the data terminals,
wherein the logic die comprises direct access (DA) terminals, channel clock signal terminals, channel command and address terminals, and channel data terminals, and
wherein the difference values or an output signal generated using the difference values are output through the DA terminals in the second test mode.

* * * * *